(12) United States Patent
Nakae et al.

(10) Patent No.: US 7,408,867 B2
(45) Date of Patent: Aug. 5, 2008

(54) METHOD OF ALIGNING AN OPTICAL FIBER, METHOD OF MANUFACTURING A SEMICONDUCTOR LASER MODULE, AND SEMICONDUCTOR LASER MODULE

(75) Inventors: Masashi Nakae, Tokyo (JP); Toshio Kimura, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 426 days.

(21) Appl. No.: 10/956,156

(22) Filed: Oct. 4, 2004

(65) Prior Publication Data

US 2005/0128924 A1      Jun. 16, 2005

Related U.S. Application Data

(63) Continuation of application No. PCT/JP02/09539, filed on Sep. 17, 2002.

(30) Foreign Application Priority Data

Apr. 4, 2002   (JP) .............................. 2002-102479

(51) Int. Cl.
*G11B 7/00* (2006.01)
(52) U.S. Cl. .................................. 369/112.17; 369/121
(58) Field of Classification Search ....................... None
See application file for complete search history.

(56) References Cited

U.S. PATENT DOCUMENTS 4,805,977 A    2/1989  Tamura et al.
5,692,082 A   11/1997  Fukushima
6,362,919 B1   3/2002  Flanders

FOREIGN PATENT DOCUMENTS

| EP | 0 312 652 A1 | 4/1989 |
|----|--------------|--------|
| EP | 1 085 622 A1 | 3/2001 |
| JP | 60-76707     | 5/1985 |

(Continued)

OTHER PUBLICATIONS

Yoshihiro Emori, et al., "Demonstration of Broadband Raman Amplifiers: a Promising Application of High-power Pumping Unit", http://www.furukawa.co.jp/review/backnum.htm, WDM Team. Opto-technology Lab., R & D Div. No. 19, Apr. 2000, pp. 42-45 (with English translation).

(Continued)

*Primary Examiner*—Paul W. Huber
(74) *Attorney, Agent, or Firm*—Oblon, Spivak, McClelland, Maier & Neustadt, P.C.

(57) ABSTRACT

A method of aligning an optical fiber according to the present invention has a first step of aligning an optical fiber by moving the optical fiber and finding a position that maximizes the power of beam outputted from the optical fiber with the use of a power meter, and a second step of moving and aligning the optical fiber in the optical axis direction (direction Z) from the position in which the optical fiber has been as a result of the alignment in the first step in a manner that makes the degree of polarization of two laser beams K1 and K2 equal to or lower than a given level with the use of a polarimeter.

22 Claims, 12 Drawing Sheets

FOREIGN PATENT DOCUMENTS

| | | |
|---|---|---|
| JP | 63-115145 | 5/1988 |
| JP | 1-291480 | 11/1989 |
| JP | 3-135511 | 6/1991 |
| JP | 4-180282 | 6/1992 |
| JP | 4-369888 | 12/1992 |
| JP | 5-53082 | 3/1993 |
| JP | 5-121838 | 5/1993 |
| JP | 7-72426 | 3/1995 |
| JP | 7-99477 | 4/1995 |
| JP | 8-248259 | 9/1996 |
| JP | 8-254668 | 10/1996 |
| JP | 9-162490 | 6/1997 |
| JP | 9-214022 | 8/1997 |
| JP | 10-62720 | 3/1998 |
| JP | 2000-031575 | 1/2000 |
| JP | 2000-31575 | 1/2000 |
| JP | 2001-59925 | 3/2001 |
| JP | 2002-023019 | 1/2002 |
| WO | WO 03/085435 | 10/2003 |

OTHER PUBLICATIONS

Patent Abstracts of Japan, JP 62-189422, Aug. 19, 1987.

YAG LASER WELDING SPOT

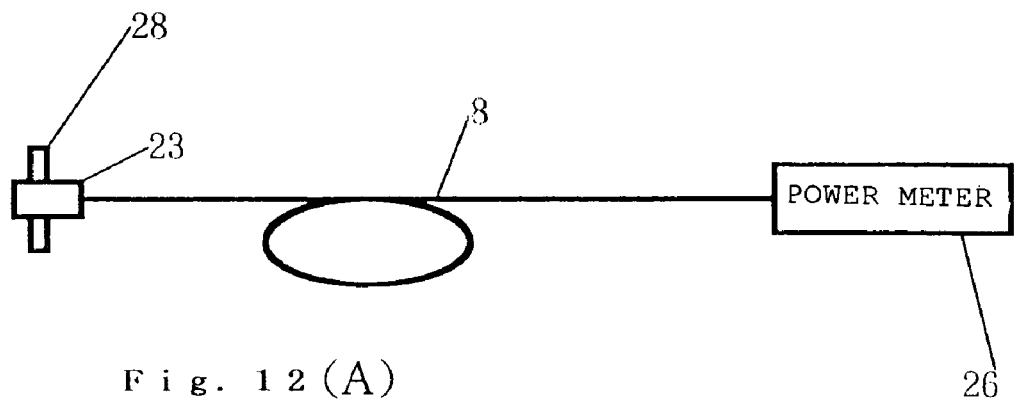
Fig. 1 2 (A)
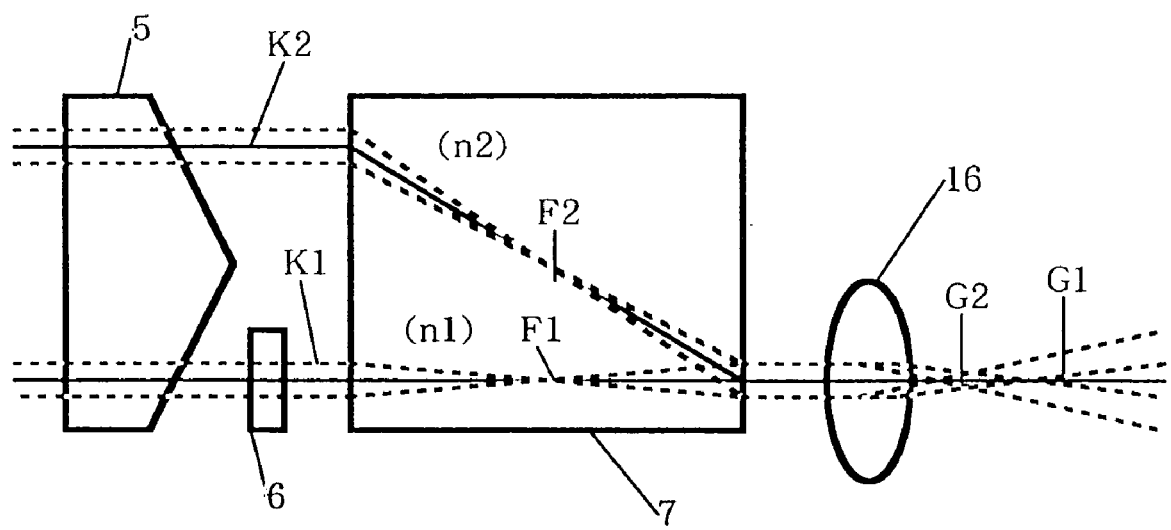
Fig. 1 2 (B)
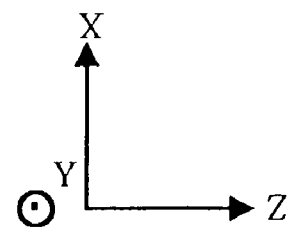

US 7,408,867 B2

METHOD OF ALIGNING AN OPTICAL FIBER, METHOD OF MANUFACTURING A SEMICONDUCTOR LASER MODULE, AND SEMICONDUCTOR LASER MODULE

This application is a continuation of international application serial No. PCT/JP02/09539 filed on Sep. 17, 2002, the entire content of which is incorporated herein by reference.

TECHNICAL FIELD

The present invention relates to a method of aligning an optical fiber, a method of manufacturing a semiconductor laser module, and a semiconductor laser module. More specifically, the invention relates to a method of aligning an optical fiber, a method of manufacturing a semiconductor laser module, and a semiconductor laser module in which two laser beams are polarization-combined before received by an optical fiber.

BACKGROUND ART

With progress in the optical communications based on a dense wavelength division multiplexing transmission system over the recent years, a higher output is increasingly demanded to a pumping light source used for the optical amplifier.

Further, a greater expectation is recently given to a Raman amplifier as an amplifier for amplifying the light having a much broader band than by an erbium-doped optical amplifier that has hitherto been employed as the optical amplifier. The Raman amplifier may be defined as a method of amplifying the optical signals, which utilizes such a phenomenon that a gain occurs on the side of frequencies as low as 13 THz on the basis of a pumping wavelength due to the stimulated Raman scattering occurred when the pumping beams enter an optical fiber, and, when the signal beams having the wavelength range containing the gain described above are inputted to the optical fiber in the thus excited state, these signals are amplified.

According to the Raman amplification, the signal beams are amplified in a state where a polarization direction of the signal beams is coincident with a polarization direction of the pumping beams, and it is therefore required that an influence by a deviation between polarization directions of the signal beams and of the pumping beams be minimized. For attaining this, a degree of polarization (DOP) has hitherto been reduced by obviating the polarization of the pumping beams, which may be called depolarization.

As a method for depolarizing a laser beam emitted from a conventional semiconductor laser module used as a pumping light source or so in the optical fiber amplifier, one in which two laser beams are polarization-combined and output from an optical fiber is known.

FIG. 11 is an explanatory diagram showing a conventional semiconductor laser apparatus as disclosed in U.S. Pat. No. 5,589,684.

As shown in FIG. 11, the conventional semiconductor laser apparatus comprises a first semiconductor laser device 100 and a second semiconductor laser device 101 each emitting a laser beam of the same wavelength in a direction vertical to the other; a first collimating lens 102 configured to collimate the laser beam emitted from the first semiconductor laser device 100; a second collimating lens 103 configured to collimate the laser beam emitted from the second semiconductor laser device 101; a polarization-combining coupler 104 configured to polarization-combine the orthogonally polarized laser beams that were collimated by the first collimating lens 102 and the second collimating lens 103; a convergent lens 105 configured to converge the laser beams polarization-combined by the polarization-combining coupler 104; and an optical fiber 107 for receiving the laser beams converged by the convergent lens 105 and letting the laser beams travel outside.

In the conventional semiconductor laser apparatus, the laser beams are emitted from the first semiconductor laser device 100 and the second semiconductor laser device 101 in mutually vertical directions and are polarization-combined by the polarization-combining coupler 104 to obtain a laser beam of reduced DOP from the optical fiber 107. (This technology will hereinafter be called a prior art 1.)

In addition, Japanese Patent Application Laid-open No. Sho 60-76707 discloses a semiconductor laser module including a first and a second semiconductor laser devices disposed on a heat sink and emitting a first and a second laser beams respectively with mutually parallel optical axes and mutually parallel polarization directions from a substantially identical light-emitting end faces; a polarization rotator disposed on an optical path of the first laser beam emitted from the first semiconductor laser device and configured to rotate the polarization direction of the first laser beam by 90 degrees such that it is orthogonal to the polarization direction of the second laser beam; a polarization element (calcite, etc.) merging optical paths of the first and second laser beams of mutually orthogonal polarizations based on its birefringence effect; an optical fiber for receiving the laser beams emerging from the polarization element and letting the laser beams travel outside; and a lens for coupling the laser beams merged through the polarization element to the optical fiber. In the semiconductor laser module of this prior art, the first and second semiconductor laser devices are housed in a package to form an unit. (This technology will hereinafter be called a prior art 2).

Further, Japanese Patent Application Laid-open No. 2000-31575 discloses a semiconductor laser module including a thermoelectric cooler; a first and a second semiconductor laser devices mounted on the thermoelectric cooler; a first and a second lenses each for collimating the first and second laser beams emitted from the first and second semiconductor laser devices; a polarization-combiner for combining the first and second laser beams; and an optical fiber for receiving the laser beams emerging from the polarization combiner and letting the laser beams travel outside. Moreover, the first and second semiconductor laser devices are formed in an LD array, in which the laser diodes are arrayed at a pitch between their light-emitting centers ( hereinafter referred to as inter-emission-center pitch) of 500 μm. Further, the first and second convergent lenses are formed in a lens array such as a ball lens array or a Fresnel lens array. (This technology will hereinafter be called a prior art 3.)

However, in the prior art 1, the lenses have to be aligned with respect to the respective laser beams emitted from the two semiconductor laser devices, which makes the manufacturing process complicated and requires a long time to manufacture.

In the prior art 2, the laser beams from the semiconductor laser device are directly received by a polarization rotator or a polarization element. The configuration therefore requires that a spacing between the semiconductor laser device and the lens be set to 300 to 500 μm or so in order to achieve a high coupling efficiency. It is difficult in practical point of view, however, to dispose the polarization rotator and the polarization element between the semiconductor laser device and the lens. Adopting a larger lens would create a larger space, but this approach will have a problem that a package needs to be larger in size than currently used, resulting in the semiconductor laser module being larger in size.

Further, in the prior art 3, two laser beams emitted at a wide interval (i.e. the inter-emission-center pitch of 500 μm) are respectively received by the separate lenses from each other and are made mutually parallel. The configuration has a problem that it is unsuitable for mass production since semiconductor laser devices are large in size and not obtained in large quantity from a single wafer. Narrowing a spacing between the stripes of the semiconductor laser device in order to obviate the above problem would need to accompany downsizing of the lenses, making it difficult to separate the laser beams emitted from the stripes and polarization-combining or optical combining of the beams that follows.

In order to solve the above problem, the applicant of the present invention has proposed a semiconductor laser module in which two laser beams emitted from two light-emitting stripes (hereinafter referred to simply as stripes) formed in a single semiconductor laser device are polarization-combined and received by an optical fiber. (See Japanese patent application No. 2001-383840, for example. This technology will hereinafter be called a related art).

FIG. 5 is an explanatory diagram schematically showing a configuration of the semiconductor laser module of the related art.

As shown in FIG. 5, the semiconductor laser module M11 of the related art includes a single semiconductor laser device 2 having a first stripe 9 and a second stripe 10 formed in parallel to each other with a spacing of 100 μm or less interposed therebetween and emitting a first laser beam K1 and a second laser beam K2 from a front end face (i.e. an end face on right-hand side in FIG. 5) of the first stripe 9 and the second stripe 10 respectively; a first lens 4 positioned so that the first laser beam K1 and the second laser beam K2 are incident therealong and configured to separate the first laser beam K1 and the second laser beam K2 in the direction in which the first and second stripes 9, 10 are arrayed; a half-wave plate 6 (a polarization rotating element) configured to rotate a polarization direction of at least one of the first and second laser beam K1, K2 (i.e. the first laser beam K1 in FIG. 5) by a predetermined angle (by 90 degrees, for example); a polarization-combining element 7 (this polarization-combining element 7 will hereinafter be called a PBC) configured to optically combine therealong the first laser beam K1 and the second laser beam K2; and an optical fiber 8 optically coupled to the combined laser beams emerging from the PBC 7 and letting the combined beams to travel outside.

In addition, a prism 5 is disposed between the first lens 4 and the half-wave plate 6 so that the first laser beam K1 and the second laser beam K2 are incident thereon and output therefrom along their respective optical axes parallel to each other. Further, a second lens 16 is disposed between the PBC 7 and the optical fiber 8 in order to optically couple the first and second laser beams K1, K2 polarization-combined by the PBC 7 to the optical fiber 8.

PBC 7 may be formed of a crystal such as rutile or YVO4.

The first laser beam K1 and the second laser beam K2 emitted respectively from the front end face 2a of the first stripe 9 and the second stripe 10 of the semiconductor laser device 2 travel through the first lens 4, intersect and separate until the separation between the two beams is enough, before entering the prism 5.

During propagation through the prism 5, the first laser beam K1 and the second laser beam K2 are made parallel to each other with a spacing D interposed therebetween, and are emitted from the prism 5. The first laser beam K1 then enters the half-wave plate 6, where its polarization direction is rotated by 90 degrees, and then enters a first input part 7a of the PBC 7, while the second laser beam K2 enters a second input part 7b of the PBC 7.

The first laser beam K1 incident on the first input part 7a and the second laser beam K2 incident on the second input part 7b are polarization-combined along the PBC 7, and output from an output part 7c.

The laser beams emerging from the PBC 7 are then converged by the second lens 16, enter an end face of the optical fiber 8 supported by the ferrule 23, and propagate to outside.

According to the semiconductor laser module M1 of the related art, a first laser beam K1 and a second laser beam K2 polarized in identical directions are emitted from a first and a second stripes 9, 10 formed in a single semiconductor laser device 2 with an interval of 100 μm or less, and are sufficiently separated by a first lens 4. Thereafter, the first laser beam K1 experiences a rotation of its polarization direction by 90 degrees through a half-wave plate 6. The first laser beam K1 and the second laser beam K2 are then polarization-combined along the PBC 7, and therefore, a high power laser beam of reduced DOP can be output from the optical fiber 8.

The above described semiconductor laser module M1 can therefore be utilized as a pumping light source for use in erbium-doped optical fiber amplifiers demanding high output, or further in Raman amplifiers in which the low polarization dependency and the stability of amplification gain are required.

In addition, since it comprises the single semiconductor laser device 2 with the two stripes each emitting one laser beam and the single first lens 4 configured to mutually separate the laser beams K1 and K2, it takes less time to align the semiconductor laser device 2 and the first lens 4. Consequently, manufacturing time of the semiconductor laser module M1 can be shorter.

Further, since the two laser beams emitted from the single semiconductor laser device 2 travel in substantially identical directions, the optical output obtained from the optical fiber 8 can be stabilized by suppressing a warpage of a package, accommodating the semiconductor laser device 2, the first lens 4, the half-wave plate 6, the PBC 7, the second lens 16, etc., along only one direction (i.e. along Z-direction in FIG. 5).

In the method of manufacturing the semiconductor laser module according to the Related Art, the step of positioning the optical fiber 8 includes a step of connecting a power meter 26 to the proximal end of the optical fiber 8 as shown in FIG. 12(A) and fixing the optical fiber 8 after the optical fiber 8 is aligned by moving a ferrule 23, which holds the optical fiber 8, in the X, Y and Z-axis directions with the use of a ferrule aligning hand 28 in a manner that makes the optical output maximum.

However, the first laser beam K1 and the second laser beam K2 differ from each other in light path physical length when passing the PBC 7 and have different refractive indices n1 and n2 as shown in FIG. 12(B) (for instance, the refractive index n1 is 2.46, whereas the refractive index n2 is 2.71) since the PBC 7 is, as has been mentioned, a birefringent element such as rutile crystal or YVO4. Positions G1 and G2 of focal points (beam waist: the portion where the laser beam spot size is smallest (where laser light is most condensed) in a Gaussian beam) of the first laser beam K1 and the second laser beam K2 which are formed optically downstream of the second lens 16 do not coincide with each other as shown in FIG. 12(B) (F1 and F2 in FIG. 12(B) indicate positions of beam waists formed through the first lens 4, whereas G1 and G2 in FIG. 12(B) indicate positions of beam waists formed through the second lens 16). The laser beams K1 and K2 also differ from each other in attenuation amount prior to coupling with the optical fiber 8, and in emission angle (FFP) and intensity upon emission from the respective stripes. These factors cause the intensity variation of laser light coupled to the optical fiber 8.

As a result, positioning the optical fiber 8 in its axial direction (Z-axis direction) in a manner that maximizes the optical output creates a difference in intensity between the orthogonal light beams coupled to the optical fiber 8. In some cases, the intensity difference makes the degree of polarization (DOP) of the combined beam larger than a desired level.

Further, the method of manufacturing the semiconductor laser module according to the Prior Art cannot always prevent the degree of polarization from exceeding an acceptable level due to a difference in characteristics (laser emission angle (FFP: Far Field Pattern) from an emission end face), optical output, and wavelength, as well as temperature dependency of these characteristics) between two semiconductor laser devices, a difference in placement of optical parts, a warped package, and the like.

DISCLOSURE OF THE INVENTION

The present invention has been made to solve the above problems, and an object of the present invention is to provide a method of aligning an optical fiber and a method of manufacturing a semiconductor laser module in which an optical fiber to which combined beam obtained by combining two laser beams through polarization synthesis is optically coupled is aligned such that the degree of polarization of the combined laser beam optically coupled to the optical fiber is equal to or lower than a predetermined level.

The present invention provides a first method of aligning an optical fiber for coupling thereto polarization-combined two laser beams, said two laser beams having been transmitted through at least one first lens and having been polarization-combined by a polarization-combiner before being optically coupled to said optical fiber via a second lens, said method comprising a step of moving and positioning said optical fiber such that a degree of polarization of said combined laser beams optically coupled to said optical fiber is equal to or less than a predetermined level.

Also, the present invention provides a second a method of aligning an optical fiber for coupling thereto polarization-combined two laser beams, said two laser beams having been transmitted through at least one first lens and having been polarization-combined by a polarization-combiner before being optically coupled to said optical fiber via a second lens; said method comprising:

a first step of moving and positioning said optical fiber such that an intensity of said combined laser beams optically coupled to said optical fiber is maximized; and a second step of moving and positioning said optical fiber in axial direction thereof such that the degree of polarization of said combined laser beams coupled to said optical fiber is equal to or less than a predetermined level.

Since the optical length of the optical path between the first and second lenses differs between two laser beams passing through the polarization-combiner, the two laser beams form beam waists at different positions in the axial direction of the optical fiber optically downstream of the second lens. If the optical fiber is moved between these positions, the efficiency at which the laser beams are coupled to the optical fiber is changed, a point is found at which the laser beams coupled to the optical fiber have an equal intensity, and thereby a degree of polarization of the combined beam can be low.

The two laser beams may form beam waists between the first lens and the second lens.

Since the beam waists are formed between the first lens and the second lens, the beam diameter can be smaller between the first lens and the second lens, and since the propagation length reduces necessary to reach a given divergent width between the two laser beams, the distance to the optical fiber can be shortened. In addition, optical parts used between the first lens and the second lens can be reduced in size.

The two laser beams may be emitted from a single semiconductor laser device having two stripes each of which emits a laser beam.

The two stripes may be parallel to each other.

The two stripes may be separated from each other with a spacing of 100 μm or less.

In the first or second method of aligning the optical fiber, the at least one first lens may be a single lens through which the two laser beams are polarized to pass, or may be a lens array composed of two lenses through which the two laser beams pass respectively.

The present invention provides a first method of manufacturing a semiconductor laser module, the semiconductor laser module including a single semiconductor laser device having two stripes separated by a spacing, each stripe emitting a laser beam, a single first lens configured to transmit and deflect said two laser beam emitted from said two stripes, a polarization-combiner configured to combine said two laser beams transmitted through said first lens, a second lens configured to converge combined laser beams emerging from said polarization-combiner, and an optical fiber configured to be optically coupled to said combined laser beams emerging from said second lens, said method comprising;

a third step of fixing said semiconductor laser device on a base;

a fourth step of fixedly aligning said first lens on said base such that said two laser beams transmitted therethrough are directed in predetermined directions;

a fifth step of fixedly aligning said polarization-combiner; and a sixth step of fixedly aligning said optical fiber by the method using the first or second optical fiber aligning method according to the present invention.

According to this structure, since two laser beams pass through the polarization-combiner, the optical length of the optical path differs between two laser beams. The difference causes the two laser beams to form beam waists at different positions in the axial direction of the optical fiber optically downstream of the second lens. Under this situation, the use of the first or second optical fiber aligning method according to the present invention enables a semiconductor laser module manufactured to emit laser light that is low in degree of polarization.

The laser module manufactured is also small in size since the laser module uses the single semiconductor laser device which has two stripes placed side by side at a distance and the single first lens through which laser beams emitted from the two stripes are polarized to pass.

In the fourth step, the first lens may be aligned such that the two laser beams that have passed through the first lens form beam waists between the first lens and the second lens.

Forming the beam waists between the first lens and the second lens makes the beam diameter smaller between the first lens and the second lens, and reduces the propagation length necessary to reach a predetermined divergent width between the two laser beams. Therefore, the length of the laser module can be shortened. The use of small-sized optical parts reduces the laser module in size.

The semiconductor laser module may further include a prism which collimates optical axes of the two laser beams that have passed through the first lens before allowing the two laser beams to exit toward the polarization-combiner, and which is held by a common holder along with the polarization-combiner. In this case, the fourth step includes a step of fixing the first lens to the base after the first lens is aligned such that optical axes of the two laser beams that have passed through the first lens and are about to enter the prism intersect with each other and are substantially symmetrical with respect to the central axis of the first lens. The fifth step in this case includes a step of fixing the polarization-combiner after the polarization-combiner is aligned by moving the holder member.

Since the two laser beams that have exited the first lens propagate while being separated from each other symmetrically with respect to the central axis of the first lens and then the prism collimates the optical axes of the two laser beams, the polarization-combiner can be designed and processed with ease, and the lens, the prism and the polarization-combiner can easily be positioned with respect to the laser device. Furthermore, fixing the polarization-combiner and the prism to the same single holder facilitates alignment of the prism and the polarization-combiner greatly.

The two stripes may be parallel to each other.

The two stripes may be separated from each other with a spacing of 100 μm or less.

The present invention provides a second of manufacturing a semiconductor laser module, the semiconductor laser module including two semiconductor laser devices each having a stripe that emits a laser beam, two first lens each configured to transmit a laser beam emitted from each of said two stripes, a polarization-combiner configured to combine said two laser beams transmitted through said two first lens, a second lens configured to converge combined laser beams emerging from said polarization-combiner, and an optical fiber configured to be optically coupled to said combined laser beams emerging from said second lens, said method comprising:

a seventh step of fixing said two semiconductor laser devices on a base;

a eighth step of fixedly aligning each of said two first lens on said base such that said each of said laser beams transmitted therethrough is directed to predetermined direction;

a ninth step of fixedly aligning said polarization-combiner; and a tenth step of fixedly aligning said optical fiber by the method using the first or second optical fiber aligning method according to the present invention.

In this structure, two laser beams which are emitted from different semiconductor laser devices and which pass through different first lenses could form beam waists at different positions in the axial direction of the optical fiber optically downstream of the second lens if the distance between one of the two semiconductor laser devices and one of the two first lenses differs from the distance between the other semiconductor laser device and the other first lens due to manufacturing variations or the like. In addition, if the two laser beams have different characteristics such as the angle of emission (FFP) from the emission end faces of the semiconductor laser devices, the laser beams are coupled to the optical fiber at different efficiencies. The combined beam obtained by combining these two laser beams through polarization synthesis cannot have a low enough degree of polarization. However, with the use of the first or second optical fiber aligning method, the second semiconductor laser module manufacturing method according to the present invention is capable of positioning the optical fiber between beam waists formed optically downstream of the second lens and thereby manufacturing a semiconductor laser module that emits laser light of low degree of polarization.

The semiconductor laser module may further include a reflector which reflects one of the two laser beams that have passed through the first lenses toward one of input parts of the polarization-combiner, and which is held by a common holder along with the polarization-combiner. In this case, the seventh step includes fixing the two semiconductor laser devices in a manner that collimates the optical axes of the two laser beams emitted from the two stripes. The ninth step in this case includes fixing the polarization-combiner after the polarization-combiner is aligned by moving the holder.

Since the polarization synthesis means and the reflector are fixed by the same single holder, the polarization synthesis means and the reflector can be aligned very easily.

The two first lenses may constitute a lens array. In this case, the seventh step includes a step of fixing the two semiconductor laser devices in a manner that collimates the optical axes of the two laser beams emitted from the two stripes.

The present invention provides a third method of manufacturing a semiconductor laser module, the semiconductor laser module including:

a single semiconductor laser device having two stripes separated by a spacing, each stripe emitting a laser beam, two first lens each configured to transmit a laser beam emitted from each of said two stripes, a polarization-combiner configured to combine said two laser beams transmitted through said two first lens, a second lens configured to converge combined laser beams emerging from said polarization-combiner, and an optical fiber configured to be optically coupled to said combined laser beams emerging from said second lens, said method comprising:

an eleventh step of fixing said semiconductor laser device on a base;

a twelfth step of fixedly aligning said two first lens on said base such that each of said two laser beams transmitted therethrough is directed to predetermined direction;

a thirteenth step of fixedly aligning said polarization-combiner on said base; and a fourteenth step of fixedly aligning said optical fiber by the method by the method using the first or second optical fiber aligning method according to the present invention.

The two stripes are parallel to each other, and the two first lenses may constitute a lens array.

The present invention provides a first semiconductor laser module comprising:

a single semiconductor laser device having a first stripe and a second stripe separated by a spacing, said first stripe and said second stripe emitting a first laser beam and a second laser beam through their respective one edge surface;

a single first lens configured to transmit and deflect said first laser beam and said second laser beam emitted from said first stripe and said second stripe;

a polarization-rotating element configured to rotate a polarization direction of at least one of said first laser beam and said second laser beam transmitted through said first lens;

a polarization-combiner including:

a first input part on which said first laser beam is incident, a second input part on which said second laser beam is incident, and an output part from which the first laser beam emerging from the first input part and the second laser beam emerging from the second input part are combined and emitted as a combined laser beam;

a base configured to mount said semiconductor laser device and said first lens;

a second lens configured to converge said combined laser beams emerging from said output part of said polarization-combiner; and an optical fiber positioned to receive said combined laser beams emerging from said second lens, wherein said optical fiber is fixed between beam waists of respective laser beams formed optically downstream of said second lens.

The first stripe and said second stripe are separated from each other with a spacing of 100 μm or less.

The present invention provides a second semiconductor laser module comprising:

a single semiconductor laser device having a first stripe and a second stripe separated by a spacing, said first stripe and said second stripe emitting a first laser beam and a second laser beam through their respective one edge surface;

two first lens each configured to transmit each of said first laser beam and said second laser beam emitted from said first stripe and said second stripe;

a polarization-rotating element configured to rotate a polarization direction of at least one of said first laser beam and said second laser beam transmitted through said first lens;

a polarization-combiner including a first input part on which said first laser beam is incident, a second input part on which said second laser beam is incident, and an output part from which the first laser beam emerging from the first input part and the second laser beam emerging from the second input part are combined and emitted as a combined laser beam;

a base configured to mount said semiconductor laser device and said two first lens;

a second lens configured to converge said combined laser beams emerging from said output part of said polarization-combiner; and an optical fiber positioned to receive said combined laser beams emerging from said second lens, wherein said optical fiber is fixed between beam waists of respective laser beams formed optically downstream of said second lens.

The present invention provides a third semiconductor laser module comprising:

two semiconductor laser devices each having a single stripe that emits a laser beam;

two first lens each configured to transmit each of first laser beam and second laser beam emitted from said two semiconductor laser devices;

a polarization-rotating element configured to rotate a polarization direction of at least one of said first laser beam and said second laser beam transmitted through said first lens;

a polarization-combiner including a first input part on which said first laser beam is incident, a second input part on which said second laser beam is incident, and an output part from which the first laser beam emerging from the first input part and the second laser beam emerging from the second input part are combined and emitted as a combined laser beam;

a reflector configured to reflectingly direct one of said first laser beam and said second laser beam transmitted through said first lens to one of said first input part and second input part of said polarization-combiner;

a base configured to mount said two semiconductor laser devices and said two first lens;

a second lens configured to converge said combined laser beams emerging from said output part of said polarization-combiner; and an optical fiber positioned to receive said combined laser beams emerging from said second lens, wherein said optical fiber is fixed between beam waists of respective laser beams formed optically downstream of said second lens.

The two first lenses may constitute a lens array.

BRIEF DESCRIPTION OF THE DRAWINGS

FIG. 12 are explanatory diagrams for illustrating an object in an optical fiber aligning method.

BEST MODE FOR CARRYING OUT THE INVENTION

Figure 5:
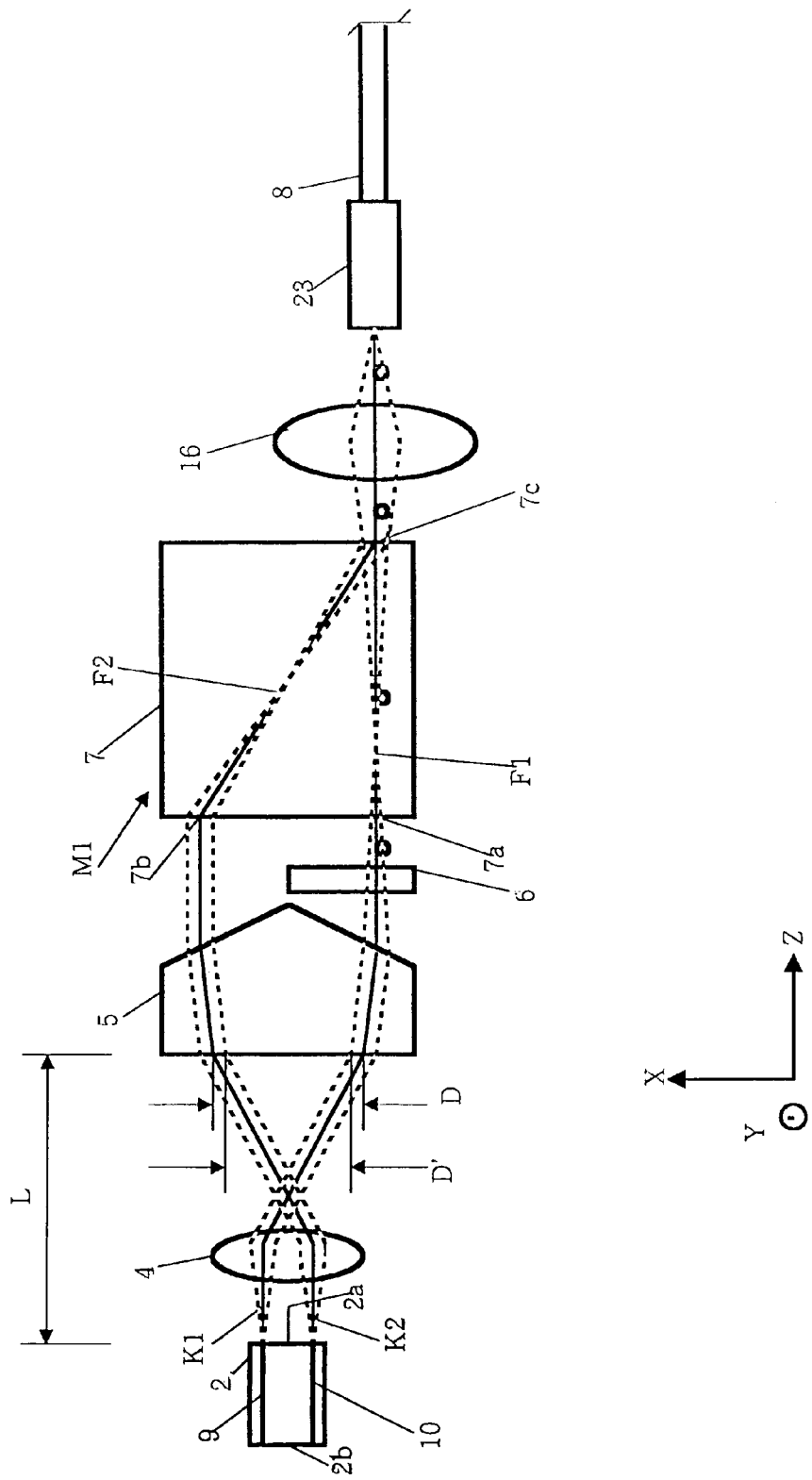
FIG. 5 is an explanatory diagram showing a schematic structure of a semiconductor laser module according to Related Art and the first embodiment of the present invention.

Embodiments of the present invention will hereinafter be described with reference to the accompanying drawings. Note that the same components as those of a semiconductor laser module shown in FIG. 5 are denoted by the same reference symbols for explanation.

First Embodiment

Figure 1:
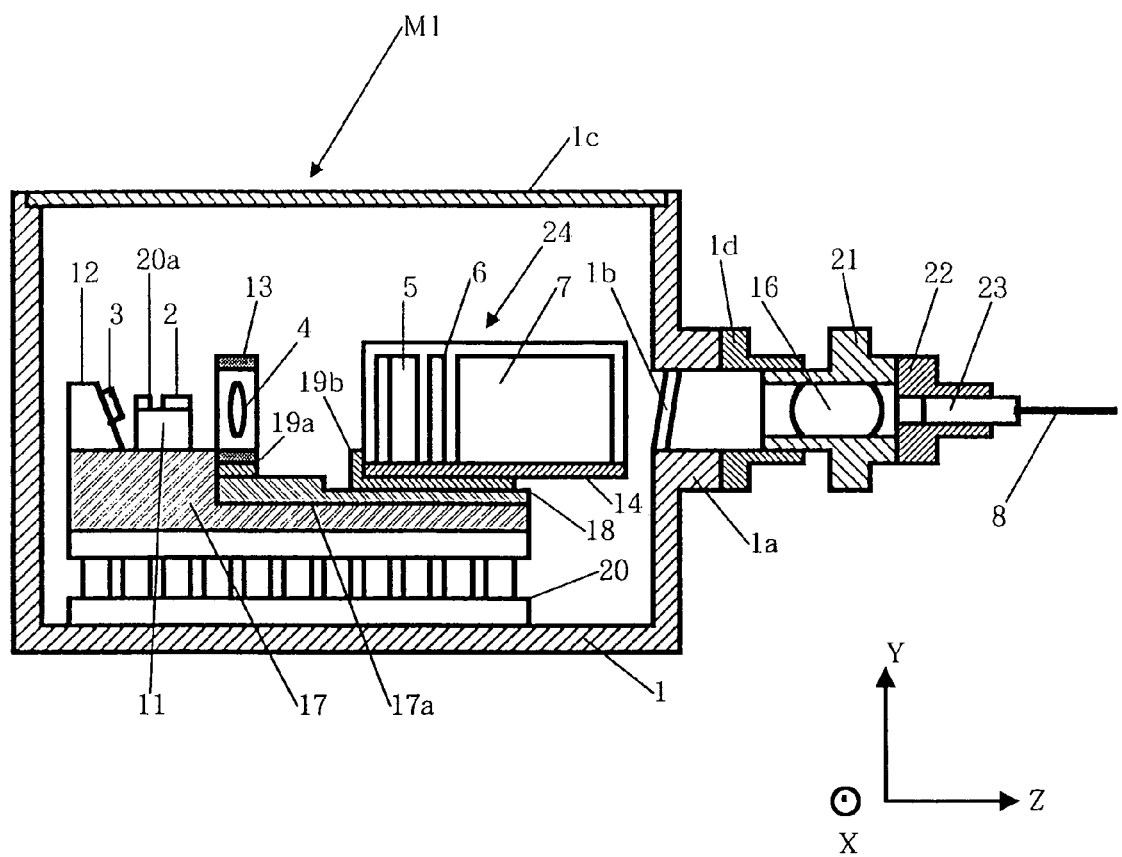
FIG. 1 is a side sectional view showing the structure of a semiconductor laser module which is manufactured according to a first embodiment of the present invention.

FIG. 1 is a side sectional view showing a configuration of a semiconductor laser module manufactured by a method in accordance with a first embodiment of the present invention.

As shown in FIG. 1, a semiconductor laser module M1 manufactured by the method in accordance with the first embodiment of the present invention includes a package 1 whose interior is hermetically sealed, a semiconductor laser device 2 encased in the package 1 for emitting laser beam, a photodiode (light receiving element) 3, a first lens 4, a prism 5, a half-wave plate (a polarization rotating element) 6, a PBC 7 as a polarization synthesis element, and an optical fiber 8.

The semiconductor laser device 2 includes, as shown in FIG. 5, a first stripe 9 and a second stripe 10 disposed at a distance on the same plane and extending in parallel in the longitudinal direction. The semiconductor laser device 2 emits a first laser beam K1 and a second laser beam K2 respectively from front end faces 2a of the first and second stripes 9 and 10. Denoted by K1 and K2 in FIG. 5 are trajectories of the centers of the laser beams that exit the first and second stripes 9 and 10, respectively. The laser beam propagates, as indicated by the broken line in FIG. 5, with some divergence about the center thereof. A space between the first stripe 9 and the second stripe 10 is set as 100 μm or less, e.g., approximately 40 to 60 μm in order for the beams K1 and K2 exiting the stripes 9 and 10 to enter one piece of first lens 4. Moreover, the space between the stripes is narrow, whereby a difference in optical output characteristic between the stripes decreases.

As shown in FIG. 1, the semiconductor laser device 2 is disposed while fixed onto a chip carrier 11 (or through a heat sink (not shown)).

The photodiode 3 receives monitor laser beam emitted from a rear-sided (left-sided in FIG. 1) end face 2b (see FIG. 5) of the semiconductor laser device 2. The photodiode 3 is fixedly attached to a photodiode carrier 12.

The first and second laser beams K1 and K2 exiting a front-sided (right-sided in FIG. 1) end face 2a (see FIG. 5) of the semiconductor laser device 2 in parallel are incident upon the first lens 4, and the first lens 4 functions to cause the laser beams K1 and K2 to intersect each other, and serves to split the beams by making a distance therebetween large in the direction in which the stripes 9 and 10 are arrayed, as well as to allow the laser beams K1 and K2 to form beam waists at different positions F1 and F2 between the first lenses 4 and the second lens 16 described later (see FIG. 5). Thus, the two laser beams K1 and K2 that have exited the first lenses 4 are unparallel to each other.

As shown in FIG. 1, the first lens 4 is held by a first lens holder member 13. Note that the first lens 4 preferably involves the use of an aspherical lens exhibiting a small spherical aberration and a high optical coupling efficiency to the optical fiber 8 to restrain an influence of a spherical aberration.

The prism 5 is disposed between the first lens 4 and the PBC 7 and substantially collimates the optical axes of the incident first and second laser beams K1 and K2 while correcting light paths thereof, thus making the laser beams K1 and K2 exit the prism 5 itself (see FIG. 5). The prism 5 is made of optical glass such as BK7 (borosilicate crown glass). The optical axes of the first and second laser beams K1 and K2 propagated from the first lens 4 unparallel to each other, which are refracted by the prism 5, are made parallel to each other. This facilitates manufacture of the PBC 7, which is placed downstream of the prism 5.

As shown in FIG. 5, the half-wave plate 6 admits an incidence of only the first laser beam K1 of the first and second laser beams K1 and K2 passing through the prism 5, and serves as a polarization rotating element for rotating by 90 degrees a polarization direction of the first laser beam K1 incident thereupon. The first lens 4 makes the first and second laser beams K1 and K2 split thoroughly, whereby the half-wave plate 6 becomes easy to dispose.

The PBC 7 has a first input part 7a on which the first laser beam K1 is incident, a second input part 7b on which the second laser beam K2 is incident, and an output part 7c where the first laser beam K1 entering the first input part 7a and the second laser beam K2 entering the second input part 7b are combined and thus exit. The PBC 7 is classified as, for instance, a birefringence element through which the first laser beam K1 propagates as an ordinary ray to the output part 7C and the second laser beam K2 propagates as an extraordinary ray to the output part 7c. The PBC 7, if being the birefringence element, is composed of, e.g., $TiO_2$ (rutile).

Figure 6:
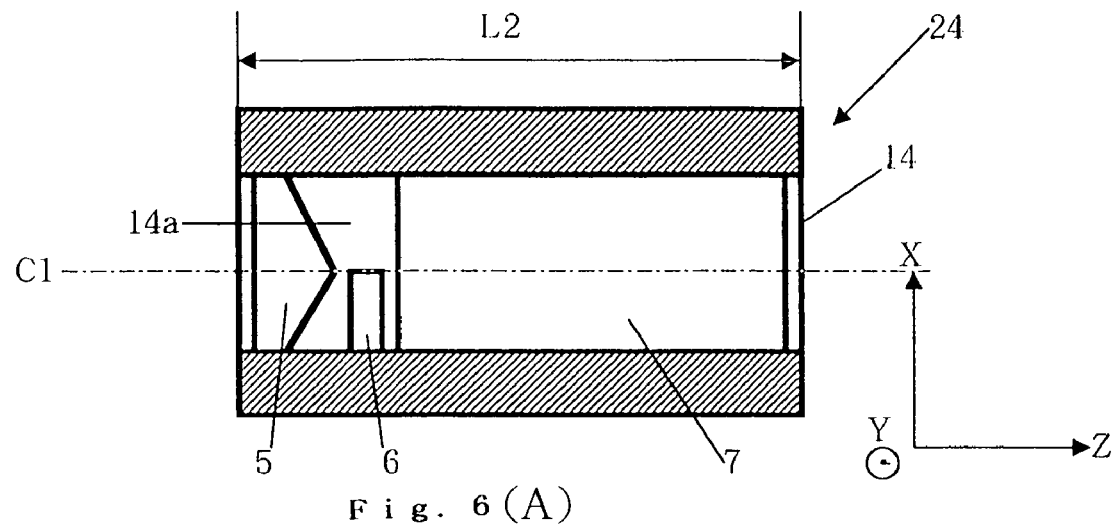
FIG. 6(A) is a cross-sectional plan view taken along the line A-A of FIG. 6(B), which shows a polarization synthesis module.
FIG. 6(B) is a side sectional view of the module.
FIG. 6(C) is a frontal view of the module.
Figure 6:
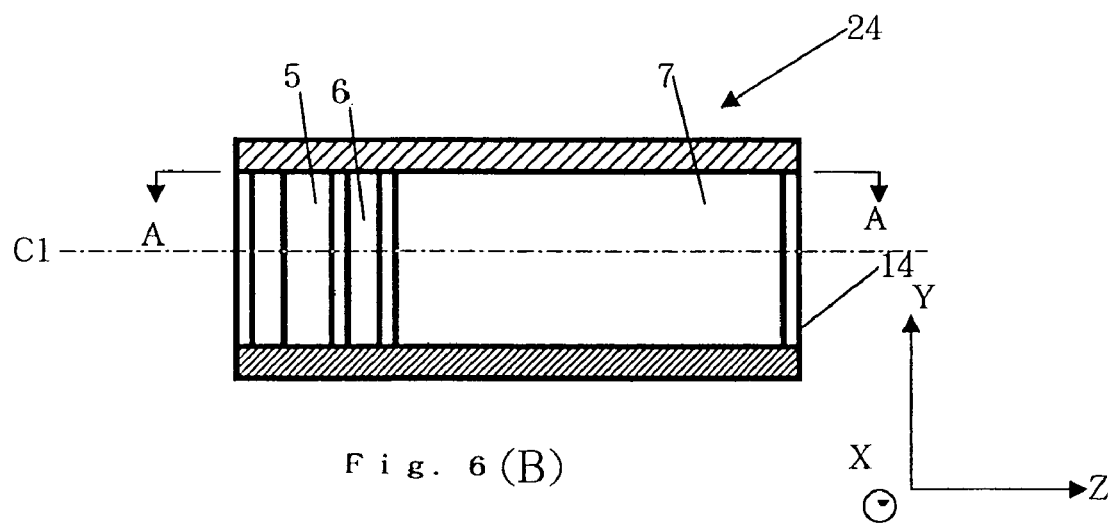
Figure 6:
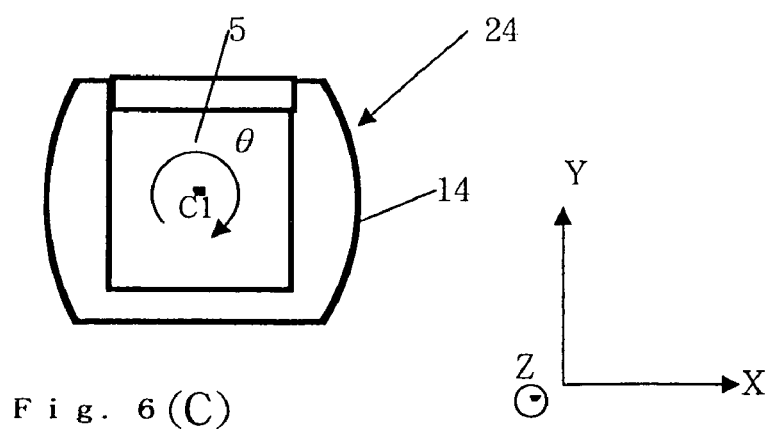
Figure 8:
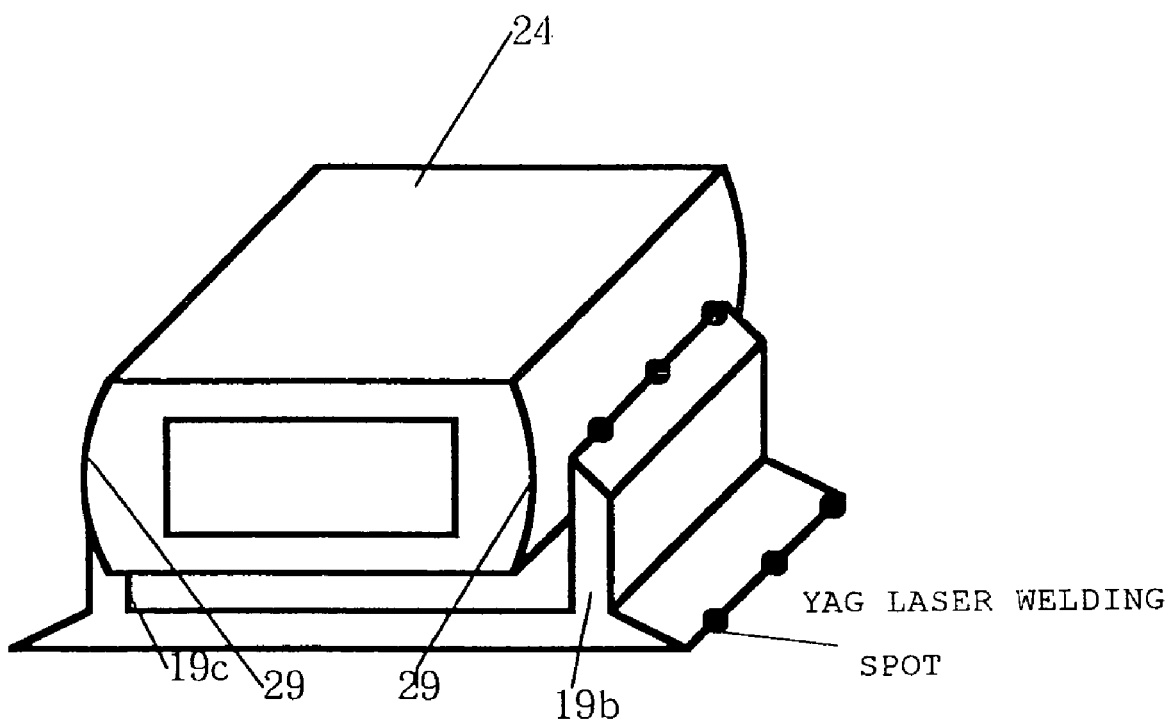
FIG. 8 is a perspective view illustrating a step of aligning and fixing the polarization synthesis module.
Figure 8:
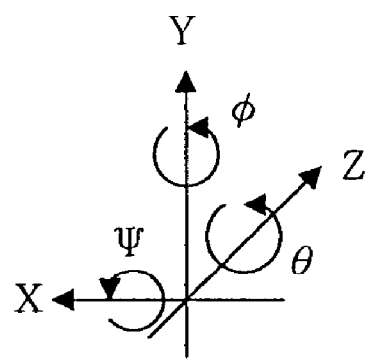

In this embodiment, a polarization synthesis module 24 is adopted in which the prism 5, the half-wave plate 6, and the PBC 7 are fixed to the same holder member 14. FIG. 6(A) shows the polarization synthesis module 24, which is a cross-sectional plan view taken along the line A-A of FIG. 6(B). FIG. 6(B) is a side sectional view thereof. FIG. 6(C) is a front view thereof. As shown in FIG. 6, the holder member 14 of the polarization synthesis module 24 is made of a material (for example, SUS 403, SUS 304, and so on) suitable for YAG laser welding. The holder member 14 is approximately 7.0 mm in its entire length L2 and is formed substantially in a cylindrical shape as a whole. A housing portion 14a is formed in the interior of the holder member 14. The prism 5, the half-wave plate 6 and the PBC 7 are fixed to the housing portion 14a. The polarization synthesis module is, as shown in FIG. 8, aligned and fixed through a second supporting member 19b formed in substantially U-shape in section.

This structure makes it easier to adjust the positions of the prism 5 and the PBC 7 around the central axis C1 so that the first laser beam K1 incident on the first input part 7a of the PBC 7 and the second laser beam K2 incident on the second input part 7b together exit from the output part 7c.

In addition, integrating these optical parts in the holder member 14 makes it possible to adjust how much the laser beams K1 and K2 overlap each other in the output part 7c by simply moving the holder member 14.

The optical fiber 8 receives the combined beam exiting the output part 7c of the PBC 7 and emits the laser beam to the outside of the package 1.

A second lens 16 for optical-coupling the laser beams emerging from the output part 7c of the PBC 7 to the optical fiber 8, is disposed between the PBC 7 and the optical fiber 8. Preferably, the first lens 4 is positioned so that the first and second laser beams K1 and K2 form beam waists F1, F2 between the first lens 4 and the second lens 16. With this contrivance, a spot size of the laser beam between the first and second lenses 4 and 16 is reduced. Therefore, a propagation distance L (see FIG. 5) is decreased which is needed for obtaining a divergent width D' of the first and second laser beams K1 and K2 sufficient for the half-wave plate 6 to be inserted only onto a light path of the first laser beam K1. Hence, a length of the semiconductor laser module M1 in the optical-axis direction can be reduced. As a result, it is feasible to provide the highly reliable semiconductor laser module M1 exhibiting an excellent stability over time of the optical coupling of the semiconductor laser device 2 to the optical fiber 8 under, e.g., a high-temperature environment.

In addition, since the laser beam spot diameter is reduced between the first lens 4 and the second lens 16, optical parts used can be reduced in size so that the small-sized semiconductor laser module M1 can be designed.

As shown in FIG. 1, the chip carrier 11 to which the semiconductor laser device 2 is fixed and the photodiode carrier 12 to which the photodiode 3 is fixed, are fixed by soldering onto a first base 17 taking substantially an L-shape in section. It is preferable that the first base 17 be composed of a CuW based alloy and so on in order to enhance a capacity of radiating the heat evolved by the semiconductor laser device 2.

The first lens holder member 13 to which the first lens 4 is fixed and the polarization synthesis module 24 with the prism 5, the half-wave plate 6 and the PBC 7 fixed to the holder member 14, are fixed by the YAG laser welding onto a second base 18, formed of a stainless steel which is fixed in advance by brazing onto a flat portion 17a of the first base 17, through the first supporting member 19a and a second supporting member 19b, respectively.

A cooling device 20 constructed of a Peltier element is provided under the first base 17. A thermistor 20a provided on the chip carrier 11 detects a rise in temperature due to the heat radiated from the semiconductor laser device 2. The cooling device 20 is controlled to keep constant the temperature detected by the thermistor 20a. This contrivance makes it feasible to increase and stabilize the output of emission of the laser beams from the semiconductor laser device 2.

A flange 1a formed at the side area of the package 1 is provided with a window 1b upon which the beams penetrating the PBC 7 are incident in its inside and with the second lens 16 for converging the laser beams at its end. The second lens 16 is held by a second lens holder member 21 fixed by the YAG laser welding to the end of the flange 1a. A ferrule 23 holding the optical fiber 8 is fixed by the YAG laser welding through a metallic slide ring 22 to the end of the second lens holder member 21.

A description on how the semiconductor laser module M1 depicted above operates can be found in the Prior Art section and therefore is omitted here.

Next, a method of manufacturing the semiconductor laser module M1 described above will hereinafter be described.

First, the chip carrier 11 to which the semiconductor laser device 2 is fixed and the photodiode carrier 12 to which the photodiode 3 is fixed, are fixed by soldering onto the first base 17.

Next, the first lens 4 is fixed onto the second base 18, which is brazed beforehand on the flat portion 17a of the first base 17, in a way that aligns the lens 4. In the step of aligning the first lens 4, the semiconductor laser device 2 is supplied with the electric current and emits the first and second laser beams K1 and K2 respectively from both of the first and second stripes 9 and 10 of the semiconductor laser device 2. Then, after setting this beam emitting direction as a reference direction, the first lens 4 is inserted and positioned in the X-, Y- and Z-axis directions.

Figure 7A:
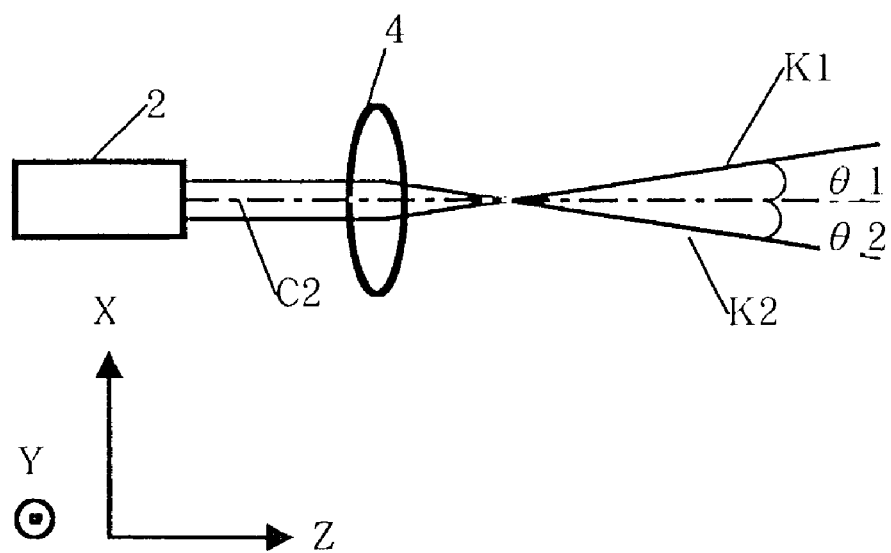
FIGS. 7 are explanatory diagrams for illustrating a step of aligning a first lens.
Figure 7B:
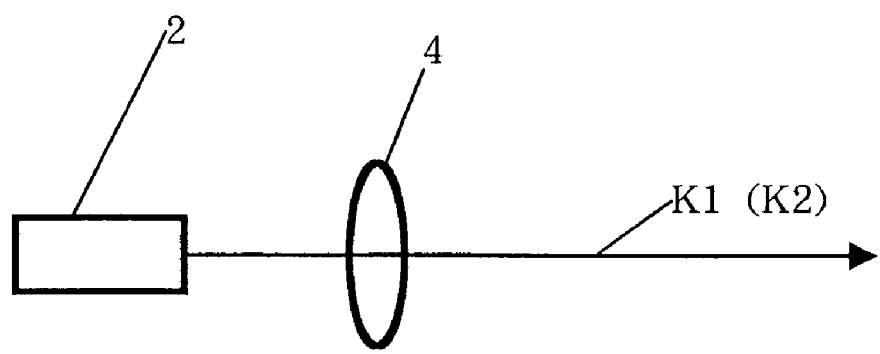
Figure 7B:
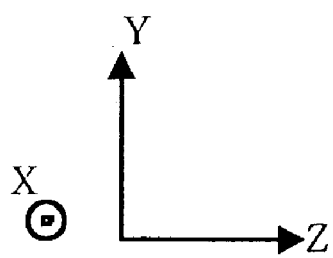

FIG. 7 are explanatory diagrams showing the step of aligning the first lens 4. The first lens 4 is, as shown in FIG. 7(A), positioned in the X-axis direction so that an angle θ1 made between the stripe reference direction (a central axis C2) set in the way described above and the first laser beam K1 is equal to an angle θ2 made between the central axis C2 and the second laser-beam K2. The first lens 4 is, as shown in FIG. 7(B), positioned in the Y-axis direction so that the first and second laser beams K1 and K2 travel through the center of the first lens 4. Further, the first lens 4 is positioned in the Z-axis direction so that a spot size of the laser beam is minimized at a predetermined distance from the semiconductor laser device 2. Preferably, the first lens 4 is positioned in the Z-axis direction so that a spot size of the respective laser beams exiting the first lens 4 is minimized at a predetermined position between the first and second lenses 4 and 16 to be fixed in the subsequent step. The first lens holder member 13, which holds the first lens 4 positioned in the aligning step described above, is fixed by the YAG laser welding onto the second base 18 through the first supporting member 19a.

Next, the polarization synthesis module 24 in which the prism 5, the half-wave plate 6 and the PBC 7 are integrated into one is aligned and fixed to the second base 18. In this step of aligning the polarization synthesis module 24, a dummy fiber (a fiber with a lens, not shown in the drawing) for positioning is placed at a position where the dummy fiber can receive combined beam from the output part 7c of the PBC 7, and the position in the X-, Y- and Z-axis directions as well as in θ (the angle around the Z axis), φ (the angle around the Y axis) and Ψ (the angle around the X axis) directions of the holder member 14 is determined in a manner that maximizes the intensity of light that is coupled to the dummy fiber (see FIG. 8). As shown in FIG. 8, the holder member 14 is positioned in the Y, Z, θ and Ψ directions while being fit in an opening 19c between the two erect walls of the second supporting member 19b which is formed in U-shape in section, and is positioned in the X-axis direction and the φ direction by being moved in the X-axis direction and the φ direction along with the second supporting member 19b.

At the position determined in the above aligning step, the holder member 14 is fixed to the second base 18 by welding the second supporting member 19b to the second base 18 through YAG laser welding and then welding the holder member 14 to the erect walls of the second supporting member 19b through YAG laser welding.

Next, the first base 17 is positioned such that laser beam exiting the output part 7c of the PBC 7 passes through the center of the flange 1a, and is fixed by solder to the top of the cooling device 20, which is fixed in advance onto the bottom plate of the package 1.

Then, the semiconductor laser device 2 and the monitor photodiode 3 are electrically connected to a lead (not shown) of the package 1 through a gold wire (not shown).

Next, a lid 1c is placed on the package 1 in an inert gas (for example, N2 or Xe) atmosphere, and the package is sealed air-tightly by resistance welding of the perimeter of the lid.

Next, the second lens 16 is aligned within the XY plane in the Z-axis direction with respect to the flange 1a of the package 1, and fixed. In this step, first, the second lens holder member 21 inserted in a slide ring 1d is moved on an end face of the flange 1a, and the slide ring 1d is welded to the end of the flange 1a by YAG laser welding at a position where exit beam from the second lens 16 becomes parallel to the central axis of the flange 1a of the package 1 (parallel to the Z axis). Then, while monitoring the spreading angle of the exit beam from the second lens 16, the second lens holder member 21 is moved in the Z-axis direction to position the second lens holder member 21 in the Z-axis direction such that the spreading angle is approximately equal to a light receiving angle (NA) of the optical fiber 8. At this position, the second lens holder member 21 and the slide ring 1d are welded by YAG laser welding.

Figure 2:
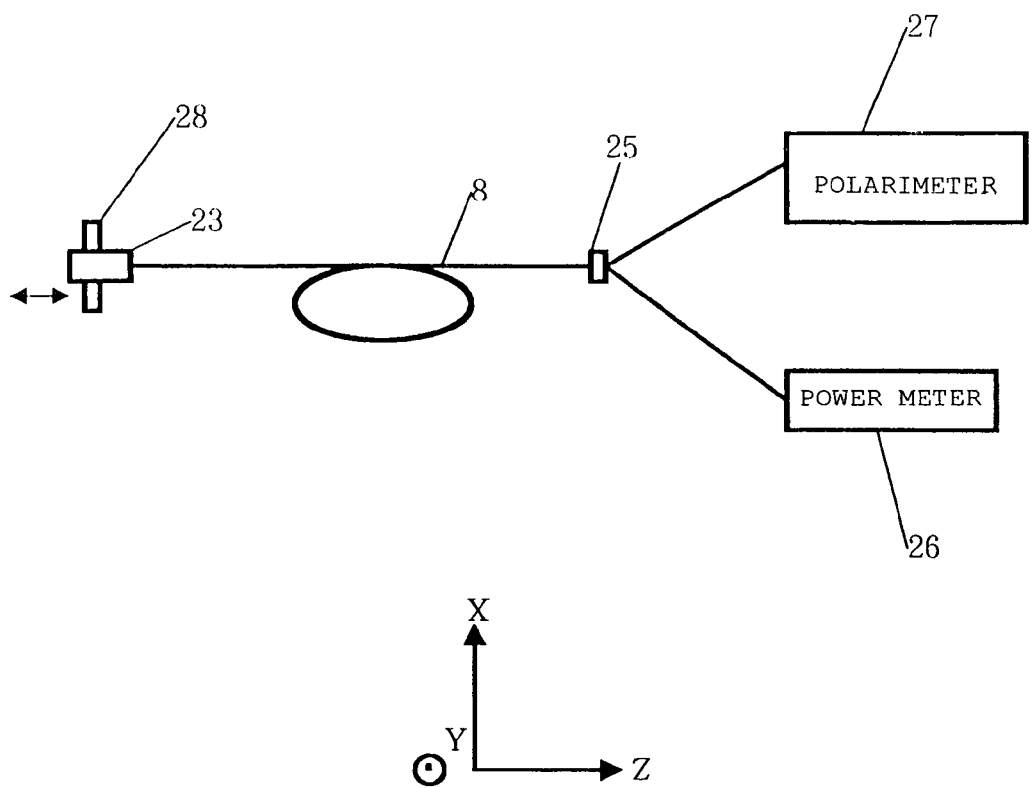
FIG. 2 is an explanatory diagram schematically showing the structure for carrying out a method according to the present invention.
Figure 3:
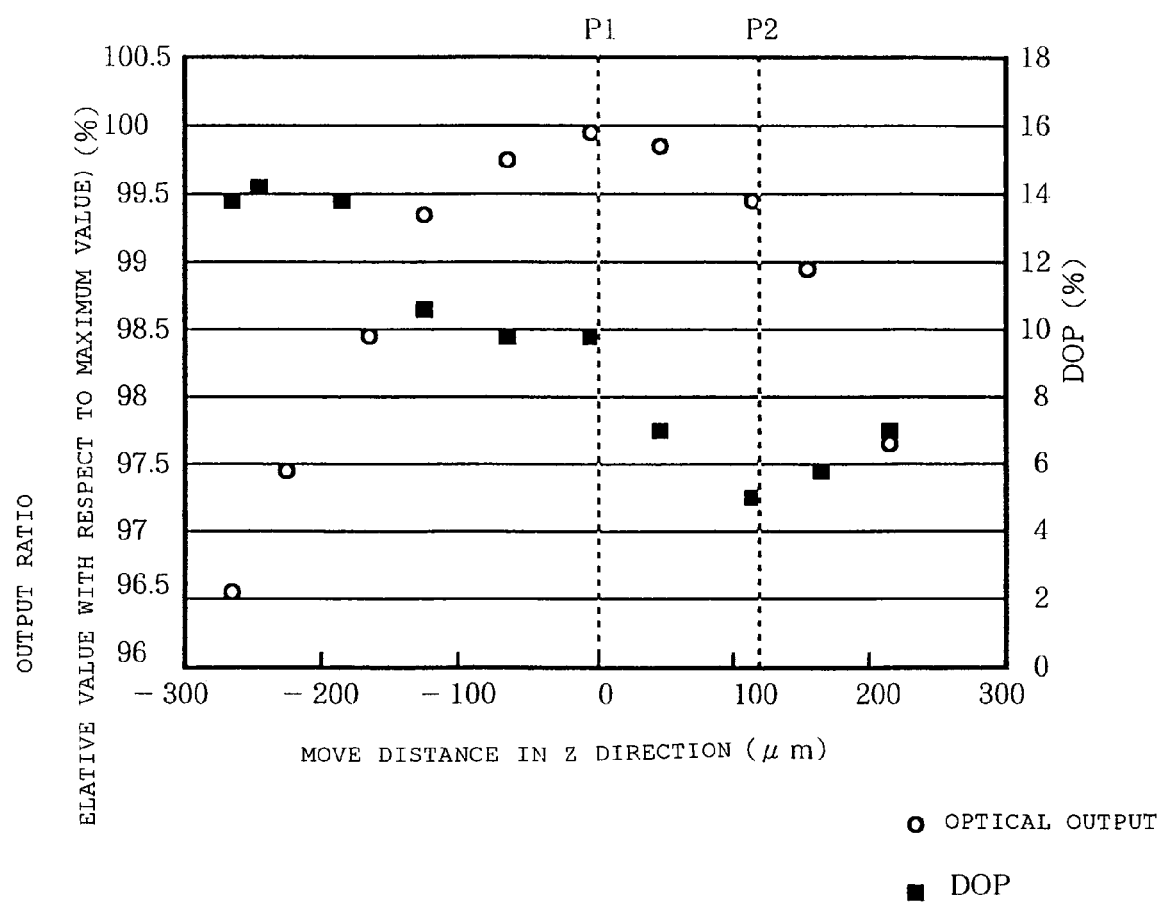
FIG. 3 is a graph showing changes in optical output (relative value with 100 being the maximum value) and degree of polarization in relation to an amount in which an optical fiber moves in a Z-axis direction according to an embodiment of the present invention.

Lastly, the optical fiber 8 is aligned and fixed. This alignment step employs an optical fiber aligning method according to the present invention. FIG. 2 is an explanatory diagram schematically showing the structure for carrying out a method according to the present invention. FIG. 3 is a graph showing changes in optical output (relative value with 100 being the maximum value) and degree of polarization (DOP) in relation to an amount by which an optical fiber moves in a Z-axis direction in an optical fiber aligning method according to an embodiment of the present invention. In FIG. 3, P1 indicates the position where the intensity of the combined beam to be coupled to the optical fiber 8 is maximum and P2 indicates the position where the degree of polarization of the combined beam to be coupled to the optical fiber 8 is minimum.

In this step, the power meter 26 and a polarimeter 27 are connected to the distal end of the optical fiber 8 through a connector 25 as shown in FIG. 2.

Then the ferrule 23 is gripped by the ferrule aligning hand 28 while inserted in the slide ring 22 and, in this state, the position of the ferrule 23 is adjusted within a plane perpendicular to the optical axis of the optical fiber 8 (the X-Y plane) and in the optical axis direction of the optical fiber 8 (the Z direction) in a manner that maximizes the optical output measured by the power meter 26. In this way, the optical fiber 8 is moved to the position indicated by P1 in FIG. 3.

Next, while measuring the degree of polarization of the combined beam, which is obtained by combining the two laser beams K1 and K2, with the polarimeter 27, the optical fiber 8 is aligned by moving the ferrule aligning hand 28, from the position determined in the alignment step described above, in the Z-axis direction in a manner that minimizes the degree of polarization or sets the degree of polarization equal to or lower than a given level (8% or lower, preferably, 5% or lower). The optical fiber 8 is thus positioned in the position indicated by P2 of FIG. 3.

After positioning the optical fiber 8 in this manner is completed, the ferrule 23 is fixed by YAG laser welding at the set position inside the slide ring 22. Then, the slide ring 22 and the second lens holder member 21 are fixed at the interface therebetween by YAG laser welding. This completes alignment and fixation of the optical fiber 8.

Figure 4:
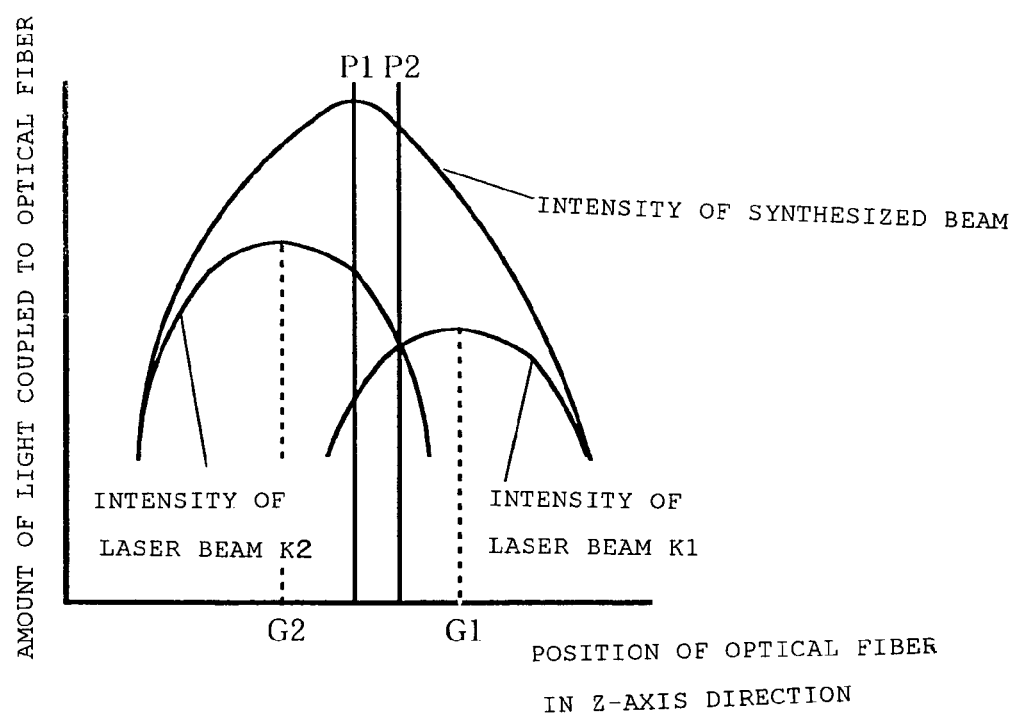
FIG. 4 is a diagram showing the intensity of two laser beams coupled to the optical fiber and the intensity of combined beam when the optical fiber is moved in the Z-axis direction.

FIG. 4 is a diagram showing the intensity of the two laser beams K1 and K2 to be coupled to the optical fiber 8 and the intensity of the combined beam when the optical fiber 8 is moved in the axial direction (Z-axis direction). In FIG. 4, G1 and G2 indicate positions of beam waists of the first and second laser beams K1 and K2, respectively, which are formed optically downstream of the second lens 16.

The misalignment between the positions G1 and G2 of the beam waists formed after the two laser beams K1 and K2 exit the second lens (see FIG. 12B) is due to a difference in optical length (the product of refractive index and physical length), which is determined by the physical length and refractive index of a laser light path upon passing through the birefringent element (PBC 7). If the laser beams differ from each other in, in addition to the optical length, attenuation amount prior to coupling with the optical fiber 8, emission angle (FFP) of the laser beams, and intensity upon emission from the respective stripes, the position of the optical fiber 8 in the Z-axis direction where the intensity of the laser beams coupled to the optical fiber 8 is maximized (where the laser beams respectively form beam waists at the positions G1 and G2 optically downstream of the second lens 16) is shifted as shown in FIG. 4 and the maximum intensity is changed as well. In this state, the position where the intensity of the combined beam coupled to the optical fiber 8 is maximum (P1 in FIG. 4) does not coincide with the position where the degree of polarization of the combined beam is minimum (P2 of FIG. 4). According to actual measurement data, as is clear from FIG. 3, the degree of polarization of the combined beam is, in some cases, about 10% larger at the position of the optical fiber where the maximum optical output is obtained (the position P1).

This embodiment has, as described above, a step of aligning the optical fiber 8 by moving the optical fiber 8 in its axial direction (the Z-axis direction) in a manner that minimizes the degree of polarization of the combined beam which has been put through polarization synthesis by the birefringent element. Therefore, the optical fiber 8 can be fixed at a position where the degree of polarization is minimum irrespective of a difference between the laser beams in optical length of the light path, attenuation amount, emission angle, or intensity upon emission from the respective stripes. A semiconductor laser module that emits laser beam of low degree of polarization can thus be manufactured.

In addition, the optical fiber 8 has to be moved only a little in the series of alignment works and accordingly the alignment efficiently is high since the optical fiber 8 is moved and aligned in a manner that minimizes the degree of polarization of the combined beam coupled to the optical fiber 8 after the optical fiber 8 is positioned in a manner that maximizes the intensity of the combined beam.

The semiconductor laser device of this embodiment has two stripes separated from each other with a spacing of 100 μm or less. The two stripes therefore have very similar characteristics, thereby making the intensity difference between laser beams emitted from the stripes small. This reduces lowering in light intensity when the optical fiber is moved from the position where the intensity of the combined beam is maximum to the position where the degree of polarization of the combined beam is minimum.

Second Embodiment

Figure 9:
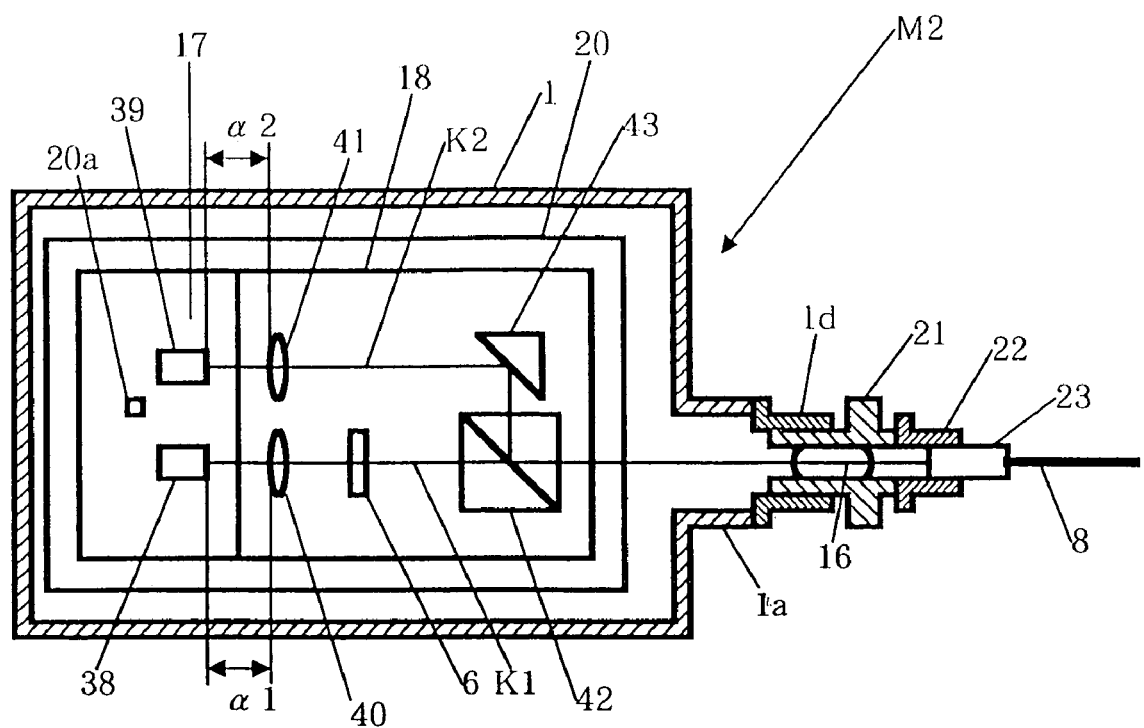
FIG. 9 is a plan view showing a semiconductor laser module according to a second embodiment of the present invention.
Figure 9:
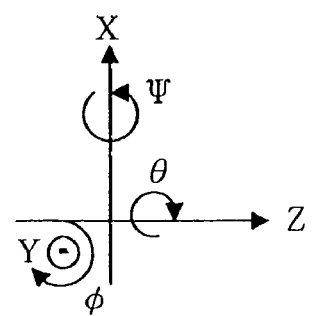

FIG. 9 is a plan view showing a semiconductor laser module M6 according to a second embodiment of the present invention. As shown in FIG. 9, the semiconductor laser module M2 according to the second embodiment of the present invention includes: a first semiconductor laser device 38 for emitting a first laser beam K1; a second semiconductor laser device 39 for emitting a second laser beam K2; two first lenses 40 and 41 on which the two laser beams K1 and K2 emitted from the two semiconductor laser devices 38 and 39 are incident, respectively; a cube beam splitter 42 as a polarization synthesis element; and a mirror 43 as a reflector that reflects the laser beam K2 toward the cube beam splitter 42. The other structure is the same as that of the first embodiment.

In the second embodiment of the present invention, the second laser beam K2 enters the cube beam splitter 42 through the mirror 43. Therefore, a light path of the first laser beam K1 and a light path of the second laser beam K2 have different optical lengths. A distance $\alpha 1$ between the first semiconductor laser device 38 and the first lens 40 and a distance $\alpha 2$ between the second semiconductor laser device 39 and the first lens 41 are adjusted such that laser beams are turned into collimated beams (a spread angle is 0°) upon exiting the first lenses 40 and 41 respectively. In practice, however, a positional shift prevents the laser beams K1 and K2 from becoming collimated beams and generally makes the distance $\alpha 1$ and the distance $\alpha 2$ differ from each other ($\alpha 1 \neq \alpha 2$). If the two laser beams K1 and K2 are converged as non-collimated beams by the shared second lens 16, the positions G1 and G2 of beam waists formed optically downstream of the second lens 16 are shifted in the axial direction of the optical fiber 8.

In addition, if the first semiconductor laser device 38 and the second semiconductor laser device 39 differ from each other in optical output or in emission angle (FFP), the intensity of light to be coupled to the optical fiber 8 is changed.

These differences could be an obstacle in sufficiently lowering the degree of polarization of the combined beam optically coupled to the optical fiber 8.

The second embodiment of the present invention overcomes those positional shift of the lenses and manufacturing variations of the semiconductor laser devices by employing the same method as that of the first embodiment to align the optical fiber 8 in a manner that reduces the degree of polarization, and thus enables the semiconductor laser module M2 to emit beam of low degree of polarization.

Preferably, the cube beam splitter 42, the mirror 43, and the half-wave plate 6 are fixed to the same holder, which has an approximately cylindrical shape on the outside and is fixed to the base 18 through the second supporting member 19b that is shaped like the letter U in section. This facilitates the positioning work.

A method of manufacturing the semiconductor laser module M2 of the second embodiment is described next.

First, the two semiconductor laser devices 38 and 39 each having one stripe are fixed to the first base 17 in a manner that makes the optical axes of laser beams emitted from the respective stripes parallel to each other. Then the photodiode 3 (not shown in the drawing) is fixed at a position where the photodiode 3 can receive the laser beams emitted from one end faces of the stripes.

Next, the two semiconductor laser devices 38 and 39 are allowed to respectively emit laser beams and the two first lenses 40 and 41 are separately aligned such that the laser beams are turned into collimated beams. Once aligned, the first lenses 40 and 41 are fixed, by YAG laser welding, through the first supporting member 19a, to the second base 18, which is made of stainless steel and which is fixed to the first base 17 in advance by brazing.

Then the holder 14 (not shown in the drawing) which has an approximately cylindrical shape on the outside and which holds the half-wave plate 6, the mirror 43, and the cube beam splitter (polarization-combiner) 42 unitarily is aligned through the second supporting member 19b which is shaped like the letter U in section. In aligning the holder 14, a not-shown dummy fiber (a fiber with a lens) is placed at a position where the dummy fiber can receive combined beam from an output part of the cube beam splitter 42. Then, the holder member 14 is moved in the X, Y, and Z directions as well as in $\theta$ (the angle around the Z axis), $\phi$ (the angle around the Y axis) and $\psi$ (the angle around the X axis) directions in a manner that maximizes the intensity of combined beam that is coupled to the dummy fiber. Once the cube beam splitter 42 is aligned, the second supporting member 19b is welded at this position to the second base 18 by YAG laser welding and then the holder 14 is fixed to the second supporting member 19b.

The subsequent manufacture steps including alignment of the optical fiber 8 are identical with those in the first embodiment, and the description will not be repeated.

Third Embodiment

Figure 10:
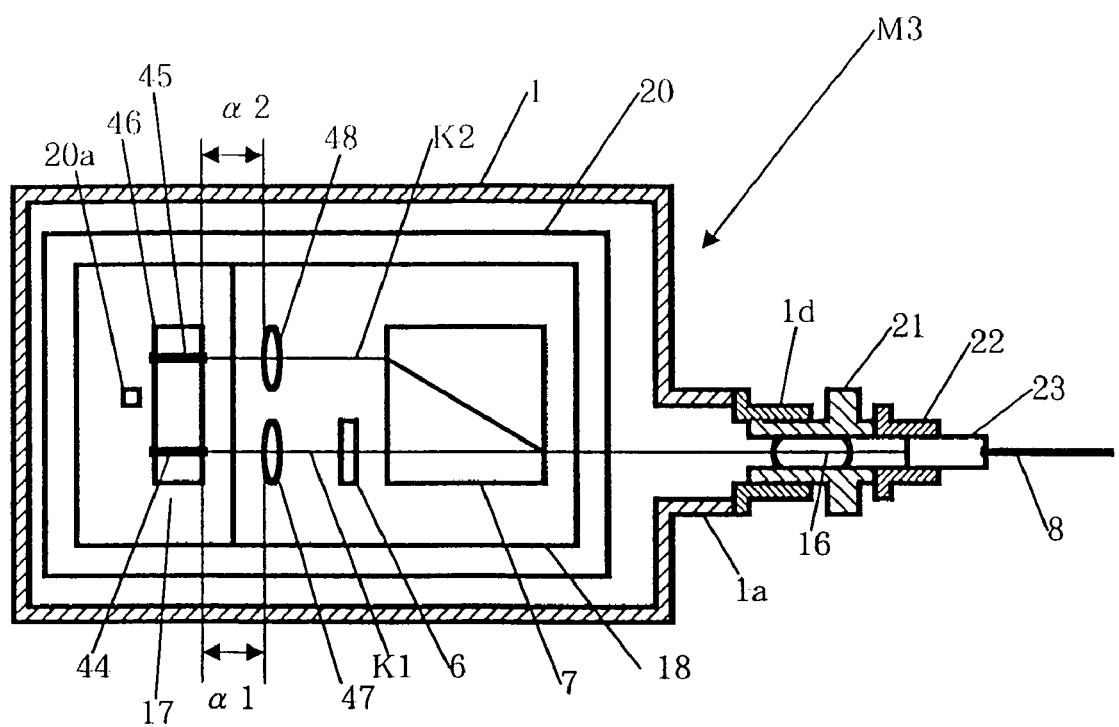
FIG. 10 is a plan view showing a semiconductor laser module according to a third embodiment of the present invention.
Figure 10:
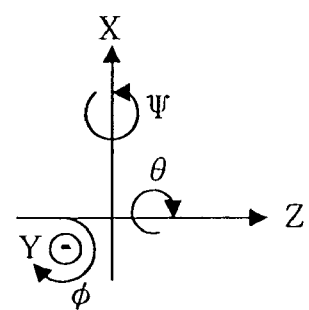
Figure 11:
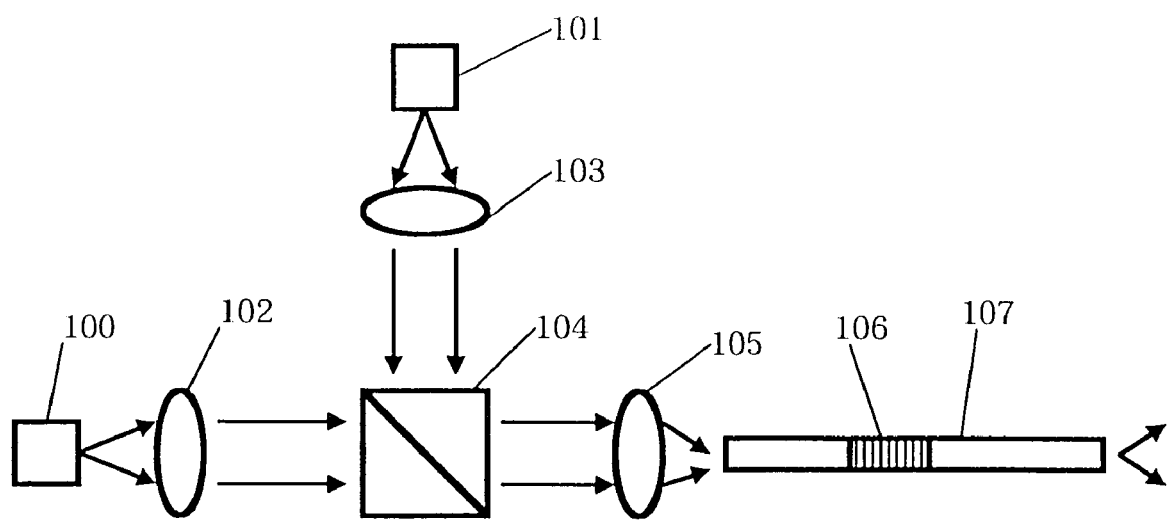
FIG. 11 is an explanatory diagram for illustrating a conventional semiconductor laser device disclosed in U.S. Pat. No. 5,589,684 B.
Figure 11:
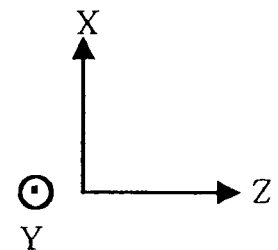

FIG. 10 is a plan view showing a semiconductor laser module according to a third embodiment of the present invention.

A semiconductor laser module M3 according to the third embodiment includes: a semiconductor laser device 46 which is an array laser equipped with a first stripe 44 and a second stripe 45 that are parallel to each other across a gap of about 500 μm; a first lens 47 for receiving the first laser beam K1 that is emitted from the first stripe 44; and a first lens 48 for receiving the second laser beam K2 that is emitted from the second stripe 45. The other structure is the same as that of the first embodiment.

The third embodiment uses the PBC 7 as in the first embodiment. Therefore, a light path of the first laser beam K1 differs from a light path of the second laser beam K2 in optical length, and the distance α1 between the first stripe 44 and the first lens 47 differs from the distance α2 between the second stripe 45 and the first lens 48 due to manufacturing variations or the like. The differences cause the positions G1 and G2 of beam waists of the laser beams K1 and K2 converged by the second lens 16 to shift in the axial direction of the optical fiber 8.

In the third embodiment, the optical fiber 8 is aligned and fixed such that an end face of the optical fiber 8 is placed between the beam waist positions G1 and G2. The semiconductor laser module M3 thus can emit light of low degree of polarization.

More preferably, as in the first embodiment, at least the PBC 7 and the half-wave plate 6 are fixed to one holder which has an approximately cylindrical shape on the outside and which is fixed to the base 18 through the second supporting member 19b shaped like the letter U in section. This facilitates the aligning and fixing work for the PBC 7, the half-wave plate 6, and others.

The third embodiment uses as a semiconductor laser device an array laser that has two stripes (the gap between the stripes is about 500 μm). However, two semiconductor laser devices may be arranged parallel to each other across a narrow gap. The first lens may be a lens array arranged at the same internal as those of the two stripes.

A method of manufacturing the semiconductor laser module M3 of the third embodiment is described next.

First, the semiconductor laser device 46 having the two stripes 44 and 45 is fixed to the first base 17. Then the photodiode 3 (not shown in the drawing) is fixed at a position where the photodiode 3 can receive laser beams emitted from rear end faces of the stripes.

Next, the two stripes 44 and 45 are allowed to respectively emit laser beams and the two first lenses 47 and 48, which constitute the lens array, are aligned such that the laser beams are turned into collimated beams. Once aligned, the first lenses 47 and 48 are fixed, by YAG laser welding, through the first supporting member 19a, to the second base 18, which is made of stainless steel and which is fixed to the first base 17 in advance by brazing.

Then the holder 14 (not shown in the drawing) which has an approximately cylindrical shape on the outside and which holds the half-wave plate 6 and the PBC 7 unitarily is aligned through the second supporting member 19b which is shaped like the letter U in section. In aligning the holder 14, a not-shown dummy fiber (a fiber with a lens) is placed at a position where the dummy fiber can receive combined beam from the output part of the PBC 7. Then, the holder member 14 is moved in the X, Y, and Z directions as well as in $\theta$ (the angle around the Z axis), $\phi$ (the angle around the Y axis) and $\Psi$ (the angle around the X axis) directions in a manner that maximizes the intensity of combined beam that is coupled to the dummy fiber. Once the PBC 7 is aligned, the second supporting member 19b is welded at this position to the second base 18 by YAG laser welding and then the holder 14 is fixed to the second supporting member 19b.

The subsequent manufacture steps including alignment of the optical fiber 8 are identical with those in the first embodiment, and the description will not be repeated.

The present invention is not limited to the embodiments described above, and various modifications are possible within the range of techniques stated in the scope of patent claims.

INDUSTRIAL APPLICABILITY

According to the present invention, an optical fiber is moved and aligned in a manner that makes the degree of polarization of two laser beams equal to or lower than a given level, thereby making it possible to manufacture a semiconductor laser module of low degree of polarization. A semiconductor laser module manufactured by a method according to an embodiment of the present invention is therefore applicable as a pumping light source of a Raman amplifier, which is requested to have a stable amplification gain that is low in polarization dependency.

The invention claimed is:

1. A method of aligning an optical fiber comprising the steps of:
   (a) positioning said optical fiber such that an intensity of a combined laser beam coupled to the optical fiber is maximized within a plane perpendicular to an optical axis of said optical fiber and in an optical axis direction of said optical fiber, the combined laser beam being composed of two laser beams transmitted through at least one first lens, combined by a combiner and converged by a second lens on the optical fiber; and
   (b) positioning said optical fiber such that a degree of polarization of the combined laser beam coupled to the optical fiber is less than or equal to a predetermined value by moving said optical fiber in an axial direction from the position determined in step (a).

2. The method according to claim 1,
   wherein the two laser beams form their respective beam waists between the first lens and the second lens.

3. The method according to claim 1,
   wherein the two laser beams are emitted from two stripes formed on a single semiconductor laser device, each stripe emitting one of the two laser beams.

4. The method according to claim 3,
   wherein the two stripes extend in parallel to each other.

5. The method according to claim 4,
   wherein the two stripes are separated by not more than 100 µm.

6. The method according to claim 1,
   wherein the at least one first lens consists of a single lens positioned such that the two laser beams are incident thereon, said single lens being configured to deflect the two laser beams.

7. The method according to claim 1,
   wherein the at least one first lens consists of two lenses together forming a lens array, each of the two lenses transmitting each of the two laser beams.

8. A method of manufacturing a semiconductor laser module, comprising:
   fixing at least one semiconductor laser device on a base, the at least one semiconductor laser device emitting two laser beams;
   aligning at least one first lens on the base such that the two laser beams incident thereon are directed in predetermined directions;
   aligning a polarization-combiner such that the two laser beams are polarization-combined therealong and emitted therefrom as a combined laser beam; and aligning an optical fiber by
   (a) positioning said optical fiber such that an intensity of a combined laser beam coupled to the optical fiber is maximized within a plane perpendicular to an optical axis of said optical fiber and in an optical axis direction of said optical fiber, the combined laser beam being composed of two laser beams transmitted through at least one first lens, combined by a combiner and converged by a second lens on the optical fiber; and
   (b) positioning said optical fiber such that a degree of polarization of the combined laser beam coupled to the optical fiber is less than or equal to a predetermined value by moving said optical fiber in an axial direction from the position determined in the step (a).

9. The method according to claim 8, further comprising aligning a second lens such that the combined laser beam is converged optically downstream thereof,
   wherein said aligning the at least one first lens includes aligning the at least one first lens such that the two laser beams form their respective beam waists between the at least one first lens and the second lens.

10. The method according to claim 8,
    wherein said fixing the at least one semiconductor laser device includes fixing two discrete semiconductor laser devices on the base, each semiconductor laser device emitting each one of the two laser beams, and
    wherein said aligning the at least one first lens includes aligning two lenses on the base such that the two laser beams are incident on the respective lenses.

11. The method according to claim 10,
    wherein said fixing the at least one semiconductor laser device includes fixing two discrete semiconductor laser devices on the base such that optical axes of the two laser beams emitted from the two semiconductor laser devices are parallel to each other, and
    wherein said aligning the polarization-combiner includes aligning the polarization-combiner along with a reflector by moving a holder holding the polarization-combiner and the reflector such that the reflector reflects one of the two laser beams emerging from the two lenses to the polarization-combiner.

12. The method according to claim 10,
    wherein said fixing the at least one semiconductor laser device includes fixing two discrete semiconductor laser devices on the base such that optical axes of the two laser beams emitted from the two semiconductor laser devices are parallel to each other, and
    wherein said aligning the at least one first lens includes aligning the two lenses formed in a lens array.

13. The method according to claim 8,
    wherein said fixing the at least one semiconductor laser device includes fixing a single semiconductor laser device on the base, the single semiconductor laser device emitting the two laser beams, and
    wherein said aligning the at least one first lens includes aligning two lenses on the base such that the two laser beams are incident on the respective lenses.

14. The method according to claim 13,
    wherein said aligning the at least one first lens includes aligning the two lenses formed in a lens array.

15. A method of manufacturing a semiconductor laser module, comprising:
    fixing at least one semiconductor laser device on a base, the at least one semiconductor laser device emitting two laser beams;
    aligning at least one first lens on the base such that the two laser beams incident thereon are directed in predetermined directions, wherein said aligning the at least one first lens includes aligning the at least one first lens on the base such that the two laser beams incident thereon are deflected;

aligning a polarization-combiner such that the two laser beams are polarization-combined therealong and emitted therefrom as a combined laser beam, wherein said aligning the polarization-combiner includes aligning the polarization-combiner along with a prism by moving a holder holding the polarization-combiner and the prism; and aligning an optical fiber such that a degree of polarization of the combined laser beam coupled to the optical fiber is less than or equal to a predetermined value.

16. The method according to claim 15,
wherein said aligning the polarization-combiner includes aligning the polarization-combiner along with the prism such that the two laser beams emerging from the at least one first lens are directed to the polarization-combiner along mutually parallel optical axes.

17. A semiconductor laser module comprising:
a single semiconductor laser device having a first stripe and a second stripe separated by a spacing, the first stripe and the second stripe emitting a first laser beam and a second laser beam through their respective one edge surfaces;
a single first lens on which the first laser beam emitted from the first stripe and the second laser beam emitted from the second stripe are incident, said single first lens being configured to deflect the first laser beam and the second laser beam;
a polarization-rotating element configured to rotate a polarization direction of at least one of the first laser beam and the second laser beam emerging from the single first lens;
a polarization-combiner including
  a first input part on which the first laser beam is incident,
  a second input part on which the second laser beam is incident, and
  an output part from which the first laser beam emerging from the first input part and the second laser beam emerging from the second input part are combined and emitted as a combined laser beam;
a base configured to mount said single semiconductor laser device and said single first lens;
a second lens configured to converge the first laser beam and the second laser beam of the combined laser beam emerging from the output part of said polarization-combiner; and
an optical fiber positioned to receive the combined laser beam emerging from said second lens,
wherein said optical fiber is fixed between beam waists of respective laser beams formed optically downstream of said second lens.

18. The semiconductor laser module of claim 17,
wherein the first stripe and the second stripe are separated by not more than 100 μm.

19. A semiconductor laser module comprising:
a single semiconductor laser device having a first stripe and a second stripe separated by a spacing, the first stripe and the second stripe emitting a first laser beam and a second laser beam through their respective one edge surfaces;
two first lenses on which the first laser beam emitted from the first stripe and the second laser beam emitted from the second stripe are respectively incident;
a polarization-rotating element configured to rotate a polarization direction of at least one of the first laser beam and the second laser beam emerging from said two first lenses;
a polarization-combiner including
  a first input part on which the first laser beam is incident,
  a second input part on which the second laser beam is incident, and
  an output part from which the first laser beam emerging from the first input part and the second laser beam emerging from the second input part are combined and emitted as a combined laser beam;
a base configured to mount said single semiconductor laser device and said two first lenses;
a second lens configured to converge the first laser beam and the second laser beam of the combined laser beam emerging from the output part of said polarization-combiner; and
an optical fiber positioned to receive the combined laser beam emerging from said second lens,
wherein said optical fiber is fixed between beam waists of respective laser beams formed optically downstream of said second lens.

20. The semiconductor laser module of claim 19,
wherein said two first lenses are formed as a lens array.

21. A semiconductor laser module comprising:
a first semiconductor laser device and a second semiconductor laser device respectively having a first stripe and a second stripe, said first stripe and said second stripe respectively emitted a first laser beam and a second laser beam;
two first lenses on which the first laser beam emitted from the first stripe and the second laser beam emitted from the second stripe are respectively incident;
a polarization-rotating element configured to rotate a polarization direction of at least one of the first laser beam and the second laser beam emerging from said two first lenses;
a polarization-combiner including
  a first input part on which the first laser beam is incident,
  a second input part on which the second laser beam is incident, and
  an output part from which the first laser beam emerging from the first input part and the second laser beam emerging from the second input part are combined and emitted as a combined laser beam;
a reflector configured to reflect one of the first laser beam and the second laser beam emerging from said two first lenses to one of the first input part and the second input part of said polarization-combiner;
a base configured to mount said first semiconductor laser device, said second semiconductor laser device, and said two first lenses;
a second lens configured to converge the first laser beam and the second laser beam of the combined laser beam emerging from the output part of said polarization-combiner; and
an optical fiber positioned to receive the combined laser beam emerging from said second lens,
wherein said optical fiber is fixed between beam waists of respective laser beams formed optically downstream of said second lens.

22. The semiconductor laser module of claim 21,
wherein said two first lenses are formed as a lens array.

* * * * *